United States Patent [19]

Aoyama

[11] Patent Number: 4,823,321

[45] Date of Patent: Apr. 18, 1989

[54] DUAL PORT TYPE SEMICONDUCTOR MEMORY DEVICE REALIZING A HIGH SPEED READ OPERATION

[75] Inventor: Keizo Aoyama, Yamato, Japan

[73] Assignee: Fujitsu Limited, Kawasaki, Japan

[21] Appl. No.: 134,997

[22] Filed: Dec. 18, 1987

[30] Foreign Application Priority Data

Dec. 19, 1986 [JP] Japan ................ 61-301602
Dec. 19, 1986 [JP] Japan ................ 61-301603
Dec. 19, 1986 [JP] Japan ................ 61-301604

[51] Int. Cl.[4] .............. G11C 7/00; G11C 8/00; G06F 1/00
[52] U.S. Cl. .................. 365/189; 365/230; 365/221; 364/900
[58] Field of Search ........... 365/233, 240, 73, 78, 365/189, 230, 221; 364/200, 900

[56] References Cited

U.S. PATENT DOCUMENTS 4,138,732 2/1979 Suzuki et al. ............ 364/900
4,433,394 2/1984 Torii et al. ............... 365/221

Primary Examiner—Terrell W. Fears
Assistant Examiner—Melissa J. Koval
Attorney, Agent, or Firm—Staas & Halsey

[57] ABSTRACT

In a dual port type semiconductor memory device (FIFO), a register is provided between a read side of a memory cell array and a data output. When data is read from the memory cell array to the data output, a content stored in the memory cell array is transmitted in advance by a preceding read instruction clock to the register, thereby enhancing the read operation speed.

5 Claims, 12 Drawing Sheets

DUAL PORT TYPE SEMICONDUCTOR MEMORY DEVICE REALIZING A HIGH SPEED READ OPERATION

BACKGROUND OF THE INVENTION

(1) Field of the Invention

The present invention relates to a dual port type semiconductor memory device such as a first-in first-out (FIFO) memory in which a write operation and a read operation are carried out in parallel.

(2) Description of the Prior Art

In a prior art FIFO memory, a write operation and a read operation are carried out in parallel at a memory cell array. The write operation is carried out by a write pointer. That is, the write pointer is reset by a write reset signal and counts a write clock signal after receiving this write reset signal. As a result, the write pointer writes input data into the i-th address location of the memory cell array, where i is the count value of the write clock signal (i=0, 1, 2, ...). On the other hand, the read operation is carried out by a read pointer. That is, the read pointer is reset by a read reset signal and counts a read clock signal after receiving this read reset signal. As a result, the read pointer reads data from the j-th address location of the memory cell array, where j is the count value of the read clock signal (j=0, 1, 2, ...).

In this prior art memory, however, the reading time is long, which will be later explained in more detail.

SUMMARY OF THE INVENTION

Therefore, an object of the present invention is provide a dual port type semiconductor memory device in which the read operation can be carried out at a higher speed.

According to the present invention, in a dual port type semiconductor memory device such as an FIFO memory, a register is provided between a memory cell array and a data output. As a result, the read pointer reads read data of a preceding address to the originally output data and stores it in the register. Therefore, when the next read instruction is supplied to the read pointer and the register, the output data is the preceding data stored in the register, not the data in the storing portion.

BRIEF DESCRIPTION OF THE DRAWINGS

The present invention will be more clearly understood from the description as set forth below, contrasting the present invention with the prior art, with reference to the accompanying drawings, wherein.

DESCRIPTION OF THE PREFERRED EMBODIMENTS

First, a prior art FIFO memory will be explained with reference to FIGS. 1 through 3.

Figure 1:
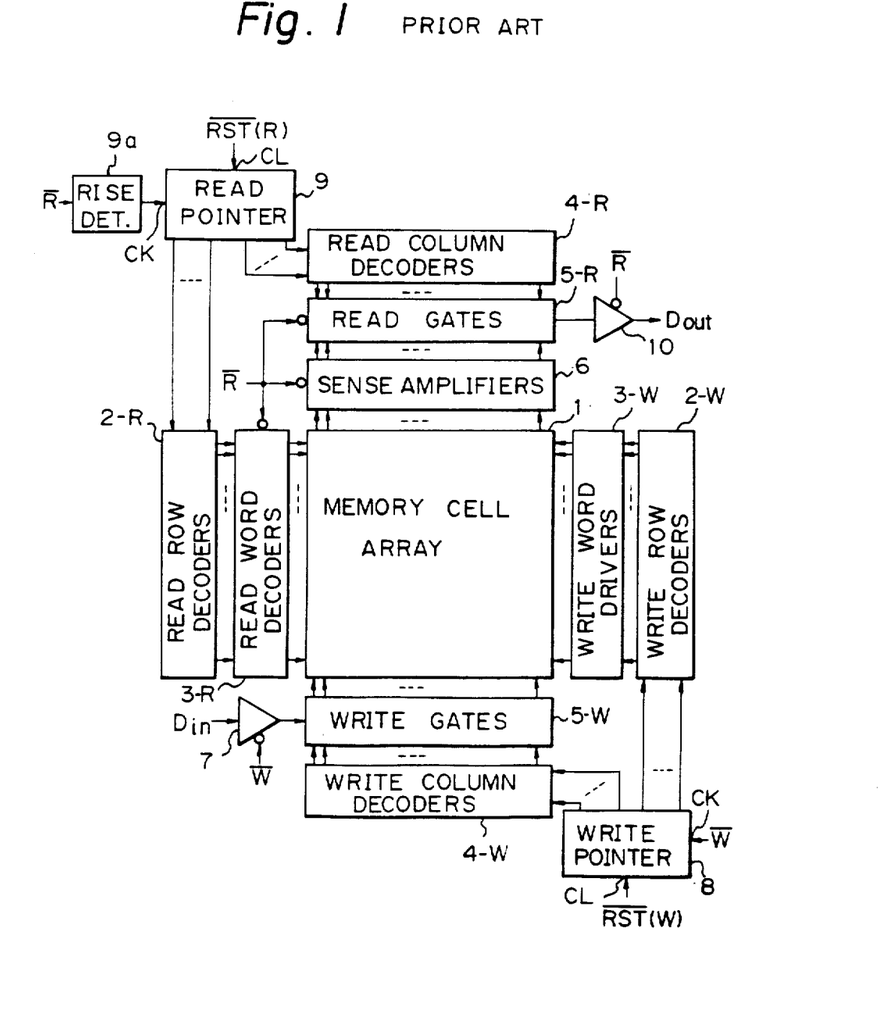
FIG. 1 is a block circuit diagram illustrating a prior art FIFO memory.

In FIG. 1, which illustrates a prior art FIFO memory, reference numeral 1 designates a dual port type static memory cell array which comprises memory cells MC. As illustrated in FIG. 2, each of the memory cells MC is connected to a write word line WL(W) and a read word line WL(R), to a pair of write bit lines BL(W) and $\overline{BL}$(W), and to a pair of read bit lines $\overline{BL}$(R) and BL(R).

In a write operation, the write word line WL(W) is selected by write row decoders 2-W and write drivers 3-W, and the write bit lines BL(W) and $\overline{BL}$(W) are selected by write column decoders 4-W and write gates 5-W. As a result, input data $D_{in}$ is written via a write amplifier 7 into the selected memory cell MC. A write pointer 8 allocates an address to the write row decoders 2-W and the write column decoders 4-W, and the write pointer 8 counts a write clock signal $\overline{w}$ after receiving a write reset signal $\overline{RST}$(W). If the count value of the pointer is i (i=0, 1, ...), the i-th address of the memory cell array 1 is selected. Note that, in the write pointer 8, CL designates a clear terminal, and CK a clock terminal.

On the other hand, in a read operation, the read word line WL(R) is selected by read row decoders 2-R and read drivers 3-R, and the read bit lines BL(R) and $\overline{BL}$(R) are selected by read column decoders 4-R and read gates 5-R. As a result, the data of the selected memory cell MC is sensed by sense amplifiers 6 and is output via a latch/read amplifier 10 as the output data $D_{out}$. A read pointer 9 allocates an address to the read row decoders 2-R and the read column decoders 4-R. The read pointer 9 counts a read clock signal ($\overline{R}$) via a rise detector 9a after receiving a read reset signal $\overline{RST}$(R). If the count value of this pointer is j (j=0, 1, ...), the j-th address of the memory cell array 1 is selected. Note that, in the read pointer 9, CL designates a clear terminal and CK a clock terminal.

Figure 2:
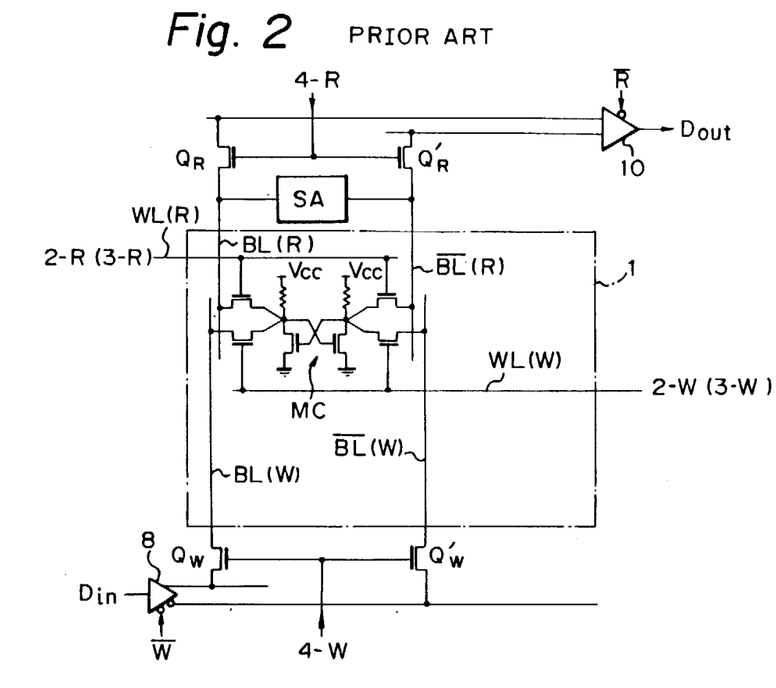
FIG. 2 is a circuit diagram of the memory cell of FIG. 2.
Figure 3:
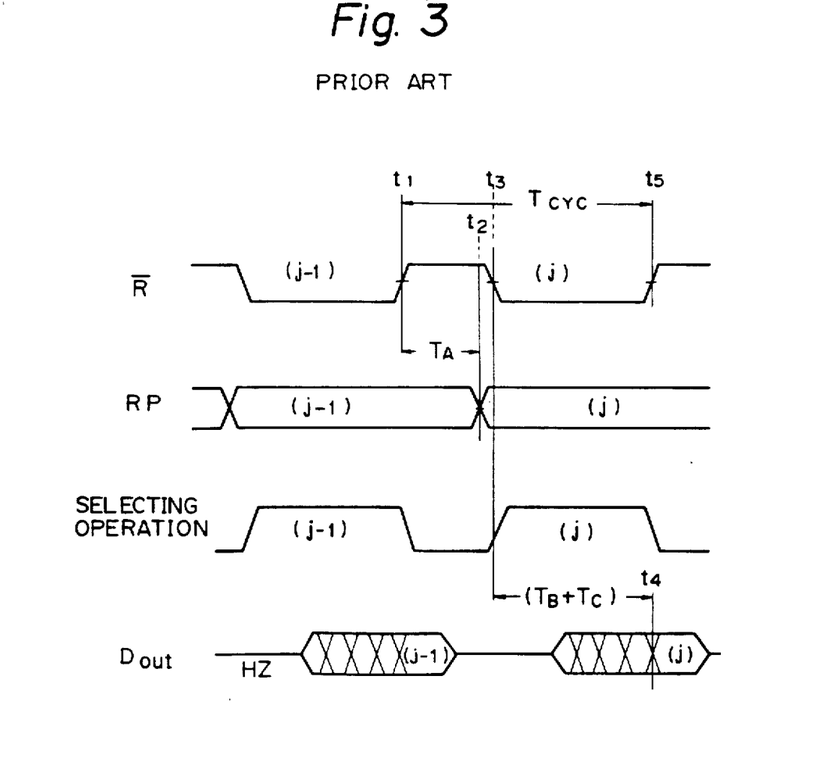
FIG. 3 is a timing diagram explaining the operation of the circuit of FIG. 1.

Note that, in FIG. 2, transistors $Q_W$ and $Q_W'$ show one bit of the write gates 5-W of FIG. 1, transistors $Q_R$ and $Q_R'$ show one bit of the read gates 5-R of FIG. 1, and SA shows one bit of the sense amplifiers 6 of FIG. 1.

The read operation of FIG. 1 will be explained with reference to FIG. 6. When the read clock signal $\overline{R}$ shows a (j−1)-th low level after the read reset signal $\overline{RST}$(R), the output RP of the read pointer 9 shows the (j−1)-th address. Note that the low level of the read clock signal / starts from the 0 address. Therefore, the selecting portion (2-R ~ 5-R) performs an access operation (in this case, a read operation) upon the (j−1)-th memory cell, thereby generating output data $D_{out}$(j−1) as illustrated in FIG. 3. Next, at time $t_1$, the read clock signal $\overline{R}$ rises. Then, at time $t_2$ after a time period $T_A$, the read pointer 9 is counted up so that the output RP thereof is changed from the (j−1)-th address to the j-th address. Further, at time t₃, the access operation of the selecting portion (2-R ~ 5-R) is transferred to an access operation for the j-th memory cell, and a sensing operation is carried out. Then, at time t₄, the output data D_out shows the stored content of the j-th address. In this case, a cycle time period T_CYC is determined by $$T_{CYC} \sim T_A + T_B + T_C \qquad (1)$$

where
- $T_A$ is a time period from the rise of the read clock signal $\overline{R}$ to the determination of the output RP of the read pointer 9;
- $T_B$ is a time period from the initiation of the operation of the selecting portion to the completion of a sensing of the read data; and
- $T_C$ is a time period from the completion of a sensing of the read data to the determination of the output data D_out via the latch/read amplifier 10.

Also, an access time $T_{AC}$ is determined by $$T_{AC} \sim T_B + T_C \qquad (2)$$

Thus, a problem arises in that the time for reading the FIFO memory is long.

Figure 4:
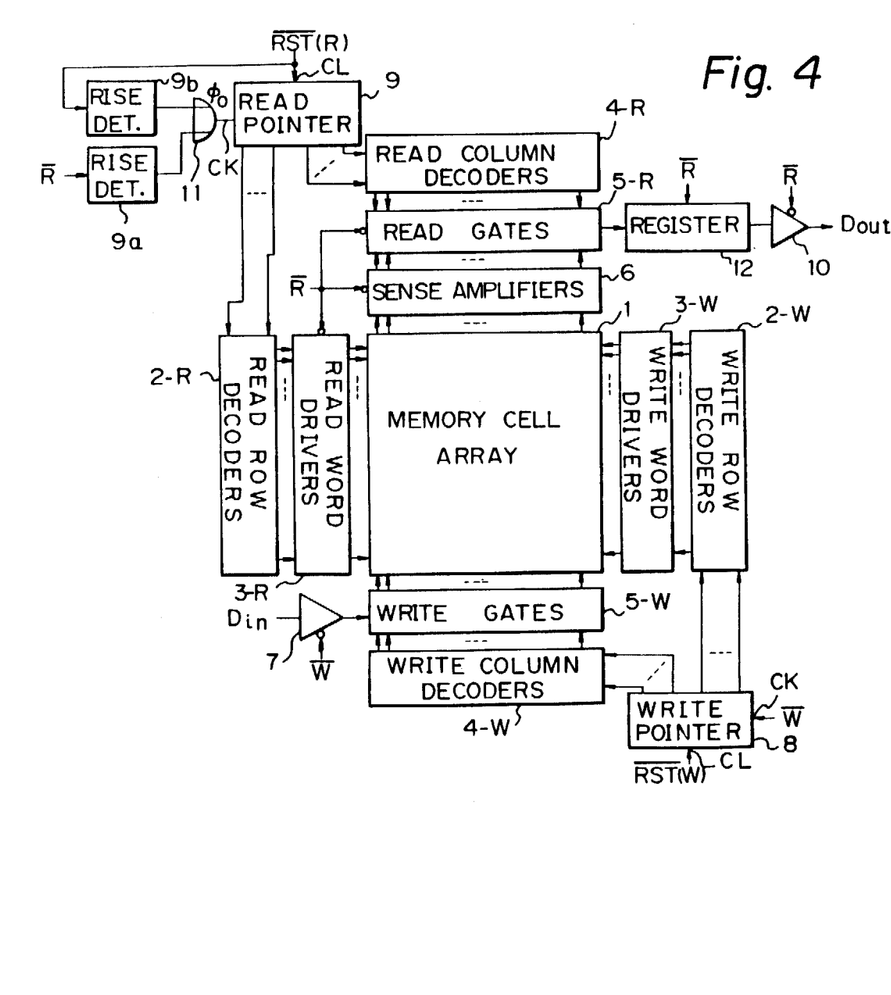
FIG. 4 is a block circuit diagram illustrating a first embodiment of the FIFO memory according to the present invention.

In FIG. 4, which illustrates a first embodiment of the present invention, a rise detector 9b, an OR circuit 11, and a register 12, are added to the elements of FIG. 1. That is, due to the addition of the rise detector 9b and the OR circuit 11, in the read pointer 9, the read reset signal $\overline{RST}(R)$ serves as the read clock $\overline{R}$ as well as the reset signal for the read pointer 9. Therefore, the output RP of the read pointer 9 of FIG. 4 precedes the output RP of the read pointer 9 of FIG. 1 by +1. This means that one read cycle of a read operation is preceded. On the other hand, the data read out of the memory cell array 1 is temporarily stored in the register 12 and is output as the output data D_out. That is, the read data from the memory cell array 1 is delayed for one read cycle. Namely, at the same read cycle, the content of the same address is read in the FIFO memory of FIG. 4 as well as in the FIFO memory of FIG. 1, but in the FIFO memory of the FIG. 4, the read data D_out is read out of the register 12 to which data is already read from the memory cell array 1, thereby reducing the read cycle itself.

The read operation of the device of FIG. 4 will be explained with reference to FIG. 5. When the read clock $\overline{R}$ shows the (j−1)-th low level after reception of the read reset signal $\overline{RST}(R)$, the output RP of the read pointer 9 shows the j-th address, since the read pointer 9 also counts the read reset signal $\overline{RST}(R)$ as the read clock signal $\overline{R}$. Therefore, the selecting portion (2-R ~ 5-R) carries out an access (read) operation for the j-th address memory cell, so that the output data D_out is as shown in FIG. 3. Next, at time t₁, the read clock signal $\overline{R}$ rises, and at time t₂ after a time period T_A, the read pointer 9 is counted up by +1. As a result, the output RP thereof is changed from the j-th address to the (j+1)-th address. In addition, at time t₃, the selecting portion (2-R ~ 5-R) moves to an access operation for the (j+1)-th address, and at this time, a sensing operation is also carried out. Simultaneously, the register 12 is transferred to a transmission mode in response to the fall of the read clock signal $\overline{R}$. That is, at time t₄, the data (j) of the register 12 is output as the output data D_out via the latch/read amplifier 10. Subsequently, at time t₅, the operation of the selecting portion (2-R ~ 5-R) and the sense amplifiers 6 is completed so that the content of the (j+1)-th address memory cell is written into the register 12. Therefore, in this case, the cycle time period T_CYC is determined by $$T_{CYC} \sim T_A + T_B \qquad (3)$$

Also, the access time period T_AC is determined by $$T_{AC} T_C' \qquad (4)$$

where $T_C'$ is a time period from the rise of the read clock signal $\overline{R}$ to the completion of a transmission mode of the register 12.

In view of the above-mentioned formulae (1) to (4), according to the first embodiment of the present invention, the cycle time T_CYC and the access time period T_AC are reduced.

Figure 6:
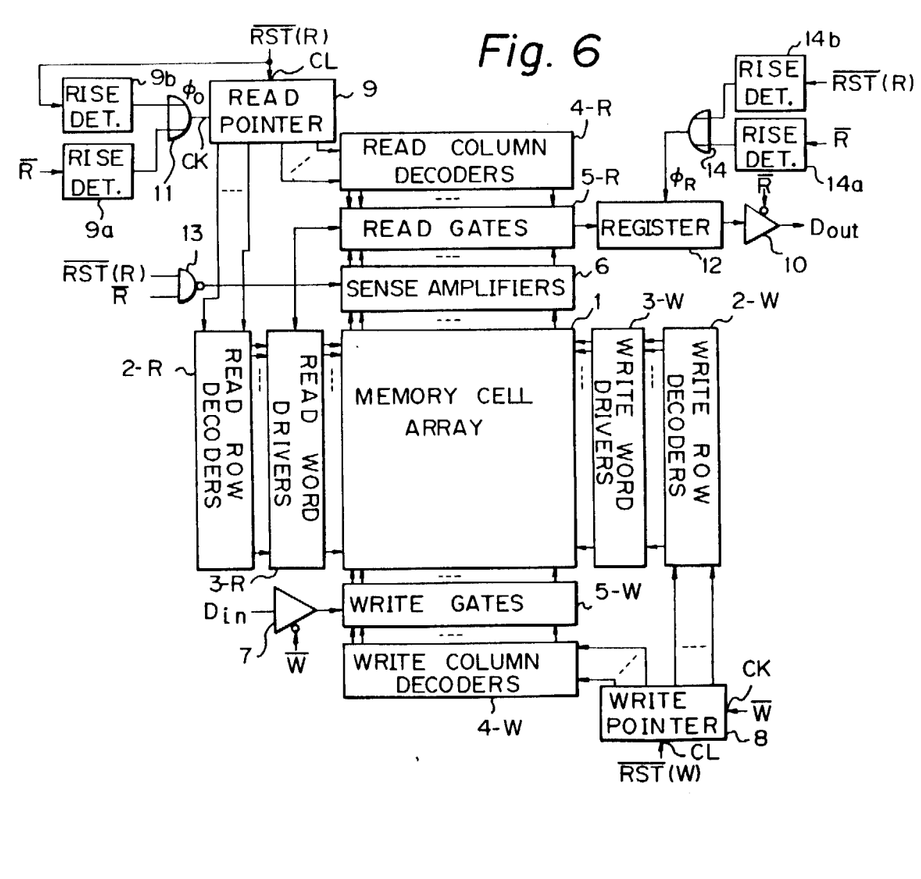
FIG. 6 is a block circuit diagram illustrating a second embodiment of the FIFO memory according to the present invention.

In FIG. 6, which illustrates a second embodiment of the present invention, a NOR circuit 13, an OR circuit 14, and rise detectors 14a and 14b are added to the elements of FIG. 4. Therefore, in FIG. 6, when the read pointer 9 is reset by the read reset signal $\overline{RST}(R)$ to operate the read row decoders 2-R and the read column decoders 4-R, to carry out a selecting operation for the 0 address, the read word drivers 3-R, the read gates 5-R, and the sense amplifiers 6 are also activated. Simultaneously, the read reset signal $\overline{RST}(R)$ operates the register 12 via the rise detector 14b and the OR circuit 14. As a result, the content of the 0 address of the memory cell array 1 is stored in the register 12.

Figure 7:
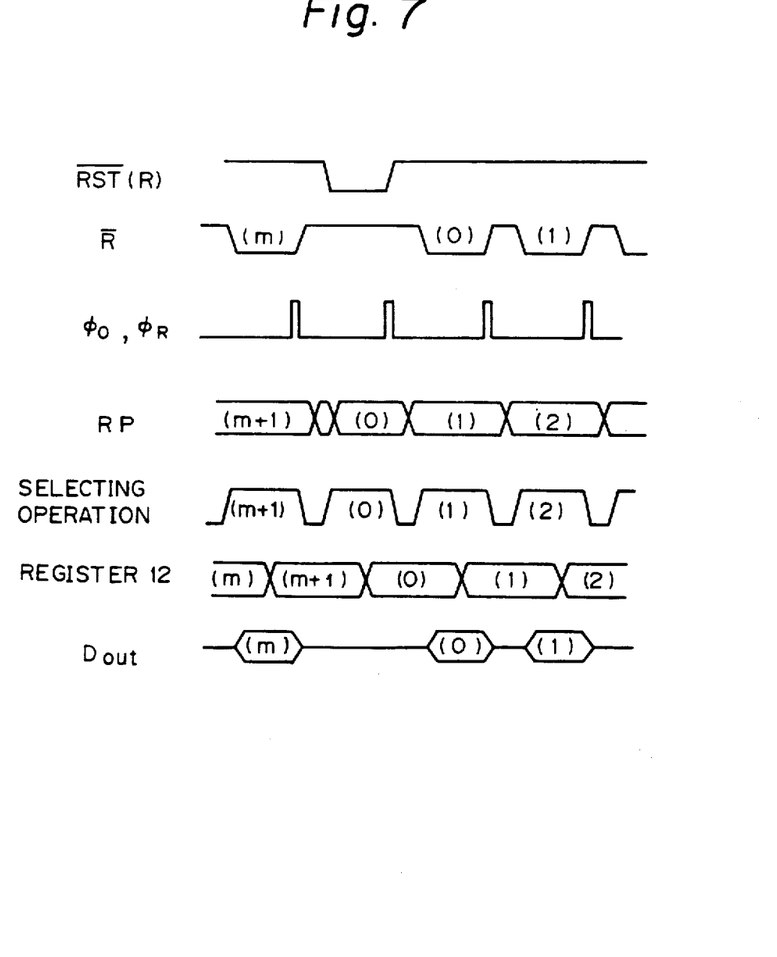
FIG. 7 is a timing diagram explaining the operation of the circuit of FIG. 6.

The operation of the device of FIG. 6 is the same as that of the device of FIG. 4, except for the operation immediately after the reception of a read reset signal $\overline{RST}(R)$, which will be explained with reference to FIG. 7. Before the read reset signal $\overline{RST}(R)$ is input, the read clock signal $\overline{R}(m)$ is input, and therefore, the output RP of the read pointer 9 shows a value (m+1) preceded by +1. As a result, the selecting portion stores the content of the (m+1)-th address of the memory cell array 1 in the register 12. In this state, when the read reset signal $\overline{RST}(R)$ becomes low, the read pointer 9 is cleared to show the 0 address. Also, the read word drivers 3-R, the read gates 5-R, and the sense amplifiers 6 are activated by the fall signal of the reset signal $\overline{RST}(R)$, and the register 12 is operated by the rise of the reset signal $\overline{RST}(R)$. Therefore, the data of the 0 address of the memory cell array 1 is read by the selecting portion and is stored in the register 12, and accordingly, the data (0) is read from the register 12 to the latch/read amplifier 10 by the next read clock signal $\overline{R}(0)$. That is, the selecting portion is operated by the read reset signal $\overline{RST}(R)$ to replace the unnecessary data (m+1) with the data (0).

Next, the case where the read reset signal $\overline{RST}(R)$ is not input to the selecting portion (3-R, 5-R, 6) will be considered. Even when the read reset signal $\overline{RST}(R)$ is input to the read pointer 9, the selecting portion is not operated, and therefore, the previously written data (m+1) remains at the register 12. In this state, when the read clock $\overline{R}(0)$ is input, the data (m+1) is read from the register 12 to the latch/read amplifier 10. This means that indefinite data is transmitted as the output D_out. Such a disadvantage is avoided by operating the selecting portion by the fall of the read reset signal $\overline{RST}(R)$.

Thus, in the second embodiment as illustrated in FIG. 6, in addition to the fact that the read speed can be increased, the read of indefinite data immediately after a read reset operation can be avoided.

Figure 8:
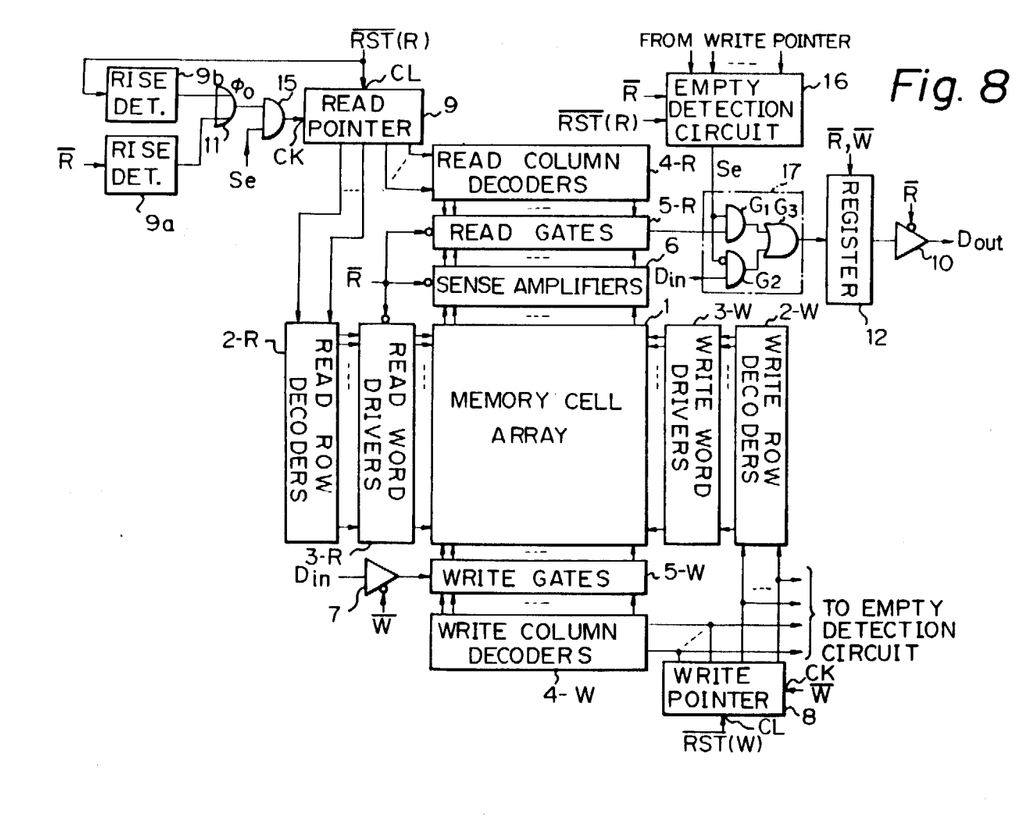
FIG. 8 is a block circuit diagram illustrating a third embodiment of the FIFO memory according to the present invention.

In FIG. 8, which illustrates a third embodiment of the present invention, an AND circuit 15, an empty detection circuit 16, and a switch circuit 17 are added to the elements of FIG. 4. The switch circuit 17 is comprised of an AND circuit $G_1$ for passing the output of the read gates 5-R therethrough, an AND circuit $G_2$ for passing input data $D_{in}$ therethrough, and an OR circuit $G_3$.

Therefore, in FIG. 8, when the empty detection circuit 16 generates an empty signal Se ("0" level), which shows that there is no data to be read in the memory cell array 1, the AND circuit 15 is closed, thereby prohibiting a read operation.

In a not-empty state of data in the memory cell array 1, i.e., in a state where data to be read exists in the memory cell array 1, data read out of the memory cell array 1 is transmitted via the AND circuit $G_1$ and the OR circuit $G_3$ of the switch circuit 17 to the register 12, and is temporarily stored in the register 12 and is output as the output data $D_{out}$. That is, the read data from the memory cell array 1 is delayed for one read cycle. Namely, at the same read cycle, the content of the same address is read in the device of FIG. 8 as well as in the device of FIG. 1, but in the device of FIG. 8, the read data $D_{out}$ is read out of the register 12 to which data is already read out of the memory cell array 1, thereby reducing the read cycle itself, in the same way as in the first embodiment as illustrated in FIG. 4.

On the other hand, in a data-empty state of the memory cell array 1, input data $D_{in}$ is written directly into the register 12 via the AND circuit $G_2$ and the OR circuit $G_3$ of the switch circuit 17.

Figure 9:
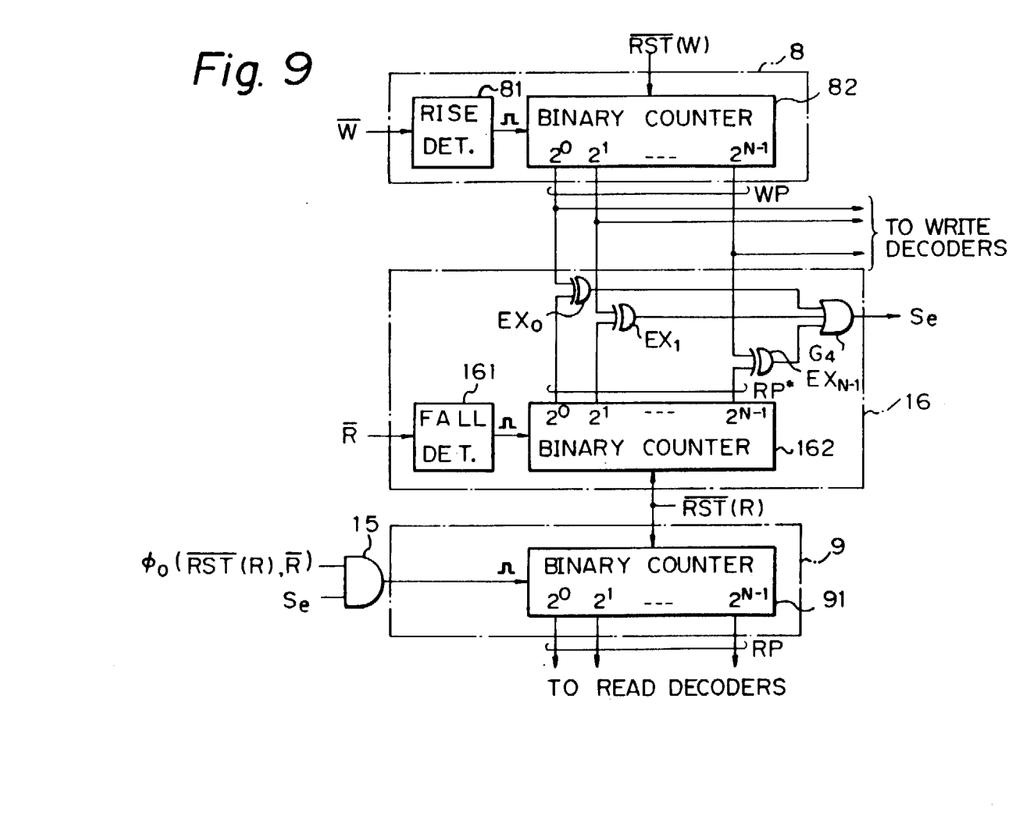
FIG. 9 is a detailed circuit diagram of the periphery of the empty detection circuit of FIG. 8.

In FIG. 9, which is a detailed circuit diagram of the periphery of the empty detection circuit 16 of FIG. 8, the write pointer 8 is comprised of a rise detector 81 for detecting a rise of the write clock signal $\overline{W}$ to generate a pulse signal, and an N-bit binary counter 82 for counting the pulse signal. The binary counter 82 is reset by a fall of the write reset signal $\overline{RST}(W)$. Similarly, the read pointer 9 is comprised of an N-bit binary counter 91 for counting a pulse signal of the AND circuit 15. Note that the read pointer 9 may be the same type as the write pointer 8, since the rise detectors 9a and 9b, the OR circuit 11, and the AND circuit 15 serve as the rise detector 81 of the write pointer 8. The binary counter 91 is reset by a fall of the read reset signal $\overline{RST}(R)$. Also the empty detection circuit 16 is comprised of a fall detector 161 for detecting a fall of the read clock signal $\overline{R}$ to generate a pulse signal, an N-bit binary counter 162 for counting this pulse signal, exclusive OR circuits $EX_0$, $EX_1$, ..., and $EX_{N-1}$ for determining the coincidence or non-coincidence between the outputs of the binary counter 162 and the outputs of the binary counter 82 of the read pointer 8, and an OR circuit $G_4$. The binary counter 162 is also reset by the read reset signal $\overline{RST}(R)$.

Here, the value WP of the write pointer 8 which is an output of the binary counter 82, shows the number of rises of the read clock signal $\overline{R}$ plus 1, and the output of the RP* of the binary counter 162 shows the number of pulses of the read clock signal $\overline{R}$ corresponding to an address of data stored in the register 12. Then, the empty detection circuit 16 generates an empty signal Se ("0" level) when the output WP of the binary counter 82 of the write pointer 8 coincides with the output RP* of the binary counter 162.

Next, the operation of the device of FIG. 8 will be explained with reference to FIGS. 10, 11, 12.

Figure 5:
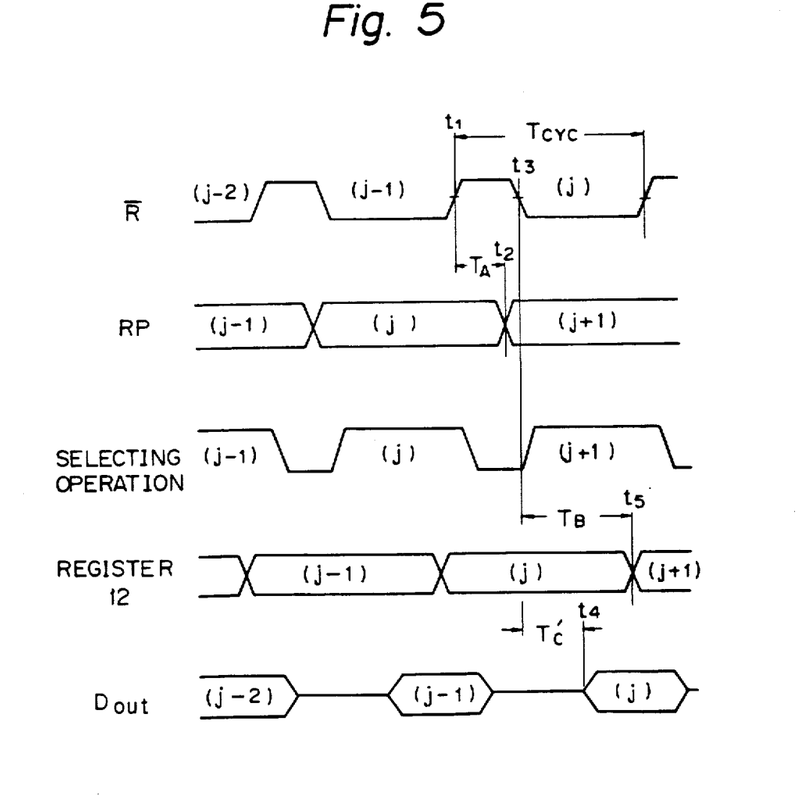
FIG. 5 is a timing diagram explaining the operation of the circuit of FIG. 4.
Figure 10:
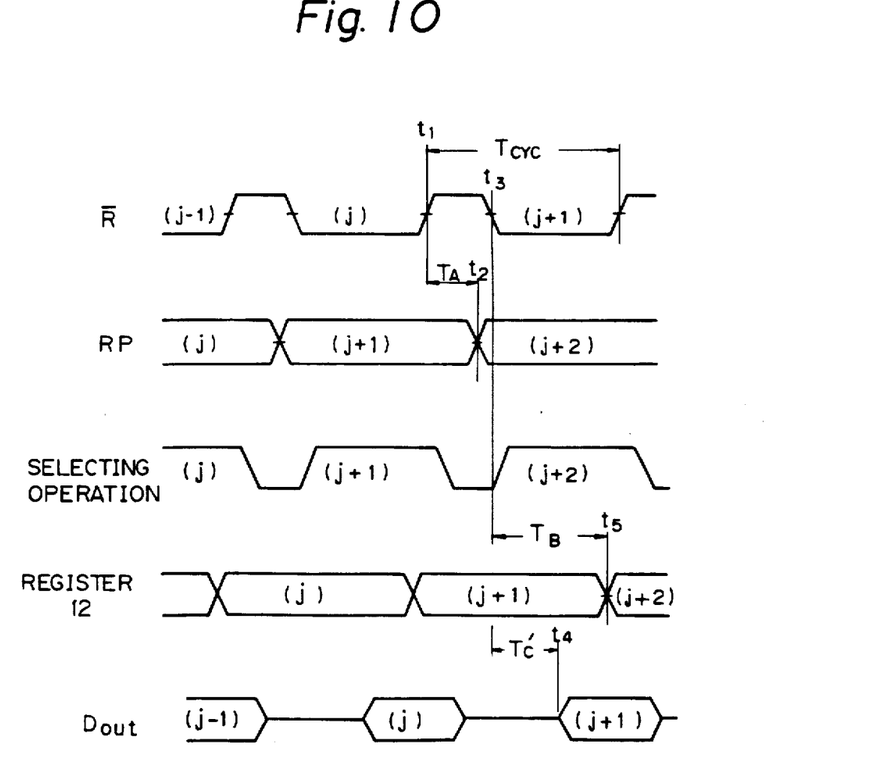
FIGS. 10, 11, and 12 are timing diagrams explaining the operation of the circuit of FIG. 8.

In FIG. 10, which explains a read operation when a not-empty data state exists in the memory cell array 1, this read operation is similar to that of FIG. 5. That is, when the read clock signal $\overline{R}$ shows the j-th low level after reception of the read reset signal $\overline{RST}(R)$, the output RP of the read pointer 9 shows the (j+1)-th address, since the read pointer 9 counts the read reset signal $\overline{RST}(R)$ as the read clock signal $\overline{R}$. Therefore, the selecting portion (2-R ~ 5-R) carries out an access (read) operation for the (j+1)-th address memory cell, so that the output data $D_{out}$ is as shown in FIG. 10. Next, at time $t_1$, the read clock $\overline{R}$ rises, and at time $t_2$, the read pointer 9 is counted up by +1. As a result, the output RP is changed from the (j+1)-th address to the (j+2)-th address. In addition, at time $t_3$, the selecting portion (2-R ~ 5-R) moves to an access operation for the (j+2)-th address, and at this time, a sensing operation is also carried out. Simultaneously, the register 12 is transferred to a transmission mode in response to the fall of the read clock signal $\overline{R}$. That is, at time $t_4$, the data (j+1) of the register 12 is output as the output data $D_{out}$ via the latch/read amplifier 10. Subsequently, at time $t_5$, the operation of the selecting portion (2-R ~ 5-R) and the sense amplifiers 6 is completed so that the content of the (j+2)-th address memory cell is written into the register 12 via the switch circuit 17. Therefore, in this case, the cycle time period $T_{CYC}$ is also determined by $$T_{CYC} \sim T_A + T_B.$$

Further, the access time period $T_{AC}$ is also determined by $$T_{AC} \sim T_C.$$

Figure 11:
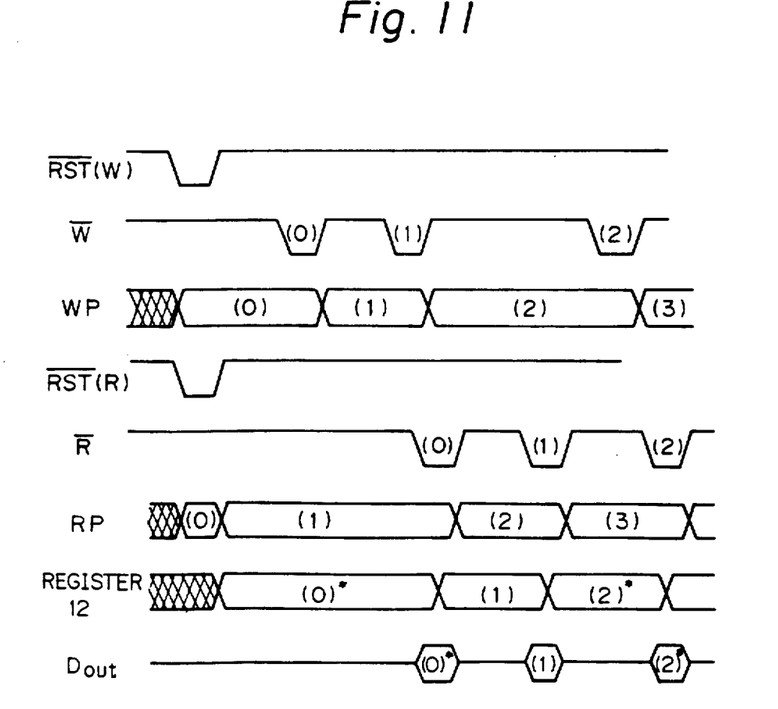

In FIG. 11, which shows a read operation when the switch circuit 17 is omitted in FIG. 8 and a not-empty data state exists in the memory cell array 1, only data read out of the read gates 5-R is written into the register 12. In this case, when the write pointer 8 receives the low levels $\overline{W}(0)$, $\overline{W}(1)$, $\overline{W}(2)$, ... of the write clock signal after the reception of the write reset signal $\overline{RST}(W)$, the output WP of the write pointer 8 is counted up by +1 at every rise $\overline{W}(1)$, $\overline{W}(2)$, $\overline{W}(3)$, ... of the write clock signal. On the other hand, the read pointer 9 is reset by a fall of the read reset signal $\overline{RST}(R)$, and immediately thereafter, the output RP of the read pointer 9 is counted up by +1 by a rise of the reset signal $\overline{RST}(R)$. Subsequently, the read pointer 9 receives the read clock and is counted up by +1 at every rise thereof. That is, the output RP of the read pointer 9 is preceded by +1 as the number of pulses of the read clock signal $\overline{R}$. Therefore, when the read reset signal $\overline{RST}(R)$ is changed from "0" level to "1" level, the content of 0 address of the memory cell array 1 is written into the register 12. However, this data (0)* is data previously written in the memory cell array 1, and therefore, the data (0)* is an indefinite value. Similarly, when the clock pulse $\overline{W}(2)$ is delayed as compared with the read clock pulse $\overline{R}(1)$, the content of 2 address of the memory cell array 1 is written into the register 12. However, this data (2)* is also data previously written in the memory cell array 1, and therefore, the data (2)* is also an indefinite value. Therefore, there is a disadvantage in that indefinite data is output from the register 12 as the output data $D_{out}$ in accordance with the read clock signal $\overline{R}$. That is, since the output RP of the read pointer 9 is preceded by +1 corresponding to the register 12, a data-empty state is quickly generated in the memory cell array 1. As a result, at this time, even when the read clock signal $\overline{R}$ is stopped, previous data remains valid in the register 12, so that the output data $D_{out}$ is indefinite.

The above-mentioned disadvantage is eliminated by the introduction of the switch circuit 17. That is, when the memory cell array 1 is in a data-empty state, the read clock signal $\overline{R}$ is stopped, and in addition, input data $D_{in}$ is written directly into the register 12 at a timing of the write clock signal $\overline{W}$.

Figure 12:
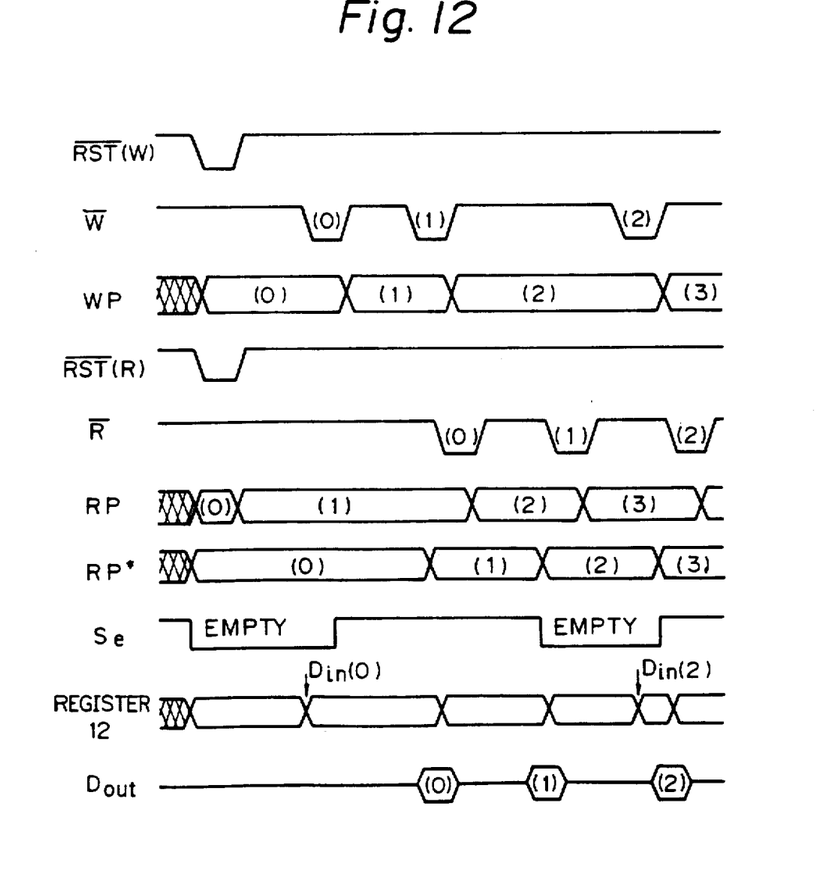

In FIG. 12, which shows a read operation when the switch circuit 17 is present in FIG. 8 and a data-empty state is generated in the memory cell array 1. Here, assume that the reset signals $\overline{RST}(W)$ and $\overline{RST}(R)$, the write clock signal $\overline{W}$, the read clock signal $\overline{R}$, the output WP of the write pointer 8, and the output RP of the read pointer 9 are changed in the same manner as in FIG. 11. In this case, the output RP* of the binary counter 162 of the empty detection circuit 16 is changed in accordance with a fall of the read clock signal $\overline{R}$. Therefore, the empty detection circuit 16 detects a coincidence between the values WP and RP* so as to generate an empty signal Se ("0" level). As a result, in such a data-empty state, input data $D_{in}$ is supplied via the AND circuit $G_2$ and the OR circuit $G_3$ of the switch circuit 17 to the register 12. At fall timings of the write clock pulses such as $\overline{W}(0)$ and $\overline{W}(2)$, the input data $D_{in}(0)$ and $D_{in}(2)$ are written therein. As a result, in the register 12, the indefinite values (0)* and (2)* are replaced by the input data $D_{in}(0)$ and $D_{in}(2)$, and therefore, at the next read timings $\overline{R}(0)$ and $\overline{R}(2)$, correct data is output as the output $D_{out}$.

Thus, in the third embodiment as illustrated in FIG. 8, in addition to the fact that the read speed can be increased, the read of indefinite data in a data-empty state can be avoided.

Note that, in the above-mentioned embodiments, although the write pointer 8 and the read pointer 9 are separately reset, these can be reset simultaneously by one reset signal.

I claim:

1. A semiconductor memory device comprising:
    a dual port storing portion to which addresses 0, 1, . . . , and n-1 are allocated;
    write pointer means which is reset by a write reset signal and counts a write clock signal after receiving said write reset signal, said write pointer means writing input data into an address location of said storing portion corresponding to the count value of said clock signal;
    read pointer means which is reset by a read reset signal and counts a read clock signal as well as said read reset signal after the reception thereof, said read pointer means reading data stored in an address location of said storing means corresponding to the count value of said read clock signal; and
    a register for storing data read by said read pointer means and transmitting said stored data as output data in response to each read clock signal.

2. A device as set forth in claim 1, wherein said read pointer means reads data stored in the 0 address of said storing means when said read pointer means receives said read reset signal, and said register stores data read by said read pointer means and transmits said stored data as output data in response to said read reset signal.

3. A device as set forth in claim 1, further comprising:
    an empty detection circuit, connected to said write pointer means, for detecting a data-empty state in said storing means, said empty detection circuit receiving said read reset signal and said read clock signal; and
    a switch circuit, connected to said read pointer means, to said register, and to said empty detection circuit, for transmitting input data directly to said register when a data-empty state is detected in said storing means, and transmitting data read by said read pointer means when a data-empty state is not detected in said storing means.

4. A device as set forth in claim 3, wherein said empty detection circuit comprises:
    a counter means for counting pulses of said read clock signal, said counter means being reset by said read reset signal; and
    comparing means, connected to said counter means and to said write pointer means, for comparing the output of said counter means with the output of said write pointer means, thereby detecting said data-empty state when the output of said counter means coincides with the output of said write pointer means.

5. A device as set forth in claim 1, wherein said device comprises an FIFO memory.

* * * * *

UNITED STATES PATENT AND TRADEMARK OFFICE
CERTIFICATE OF CORRECTION

PATENT NO. : 4,823,321
DATED : April 18, 1989
INVENTOR(S) : Keizo AOYAMA

It is certified that error appears in the above-identified patent and that said Letters Patent is hereby corrected as shown below:

Col. 1, line 21, after "is" delete blank line (i.e., "the count ..." should follow "is").

Col. 2, line 21, change "$\overline{BL}(R)$ and BL(R)" to --BL(R) and $\overrightarrow{BL}(R)$;

line 61, change "/" to --$\overline{R}$--.

Col. 4, line 9 (equation (4)), change "$T_{AC}T_{C'}$" to --$T_{AC}\tilde{\ }T_{C'}$--.

Col. 6, line 52, after "clock" insert --$\overline{R}$--;

line 61, before "clock" insert --write--.

Signed and Sealed this

Fourth Day of July, 1989

Attest:

DONALD J. QUIGG

Attesting Officer

Commissioner of Patents and Trademarks